United States Statutory Invention Registration [19]

[11] Reg. Number: H459

Stanley [43] Published: Apr. 5, 1988

[54] SYNTHESIS OF CADMIUM SULFIDE USING THE SPONTANEOUS REACTION OF DIALKYLCADMIUM AND HYDROGEN SULFIDE

[75] Inventor: Ann E. Stanley, Huntsville, Ala.

[73] Assignee: The United States of America as represented by the Secretary of the Army, Washington, D.C.

[21] Appl. No.: 67,769

[22] Filed: Jun. 29, 1987

[51] Int. Cl.[4] ..... C01B 17/00

[52] U.S. Cl. ..... 423/561 B; 156/DIG. 72; 156/DIG. 92; 427/255.2; 350/1.1; 264/1.2

*Primary Examiner*—John F. Terapane
*Assistant Examiner*—Susan Wolffe
*Attorney, Agent, or Firm*—John C. Garvin, Jr.; Freddie M. Bush

[57] ABSTRACT

Cadmium sulfide is formed successfully from the reactants hydrogen sulfide amd the representative dialkylcadmium, dimethylcadmium, spontaneously when mixed in the gas phase. Reactions are monitored using fourier transform infrared spectroscopy which also permits the identification of gaseous products. The gaseous products of this reaction are identified as methane and ethene. The stoichiometry of the cadmium sulfide depends upon the reactant pressure ratios. The process procedure and sample handling is accomplished using standard vacuum line techniques. This particular process is extremely useful, as the stoichiometry of the product cadmium sulfide can be controlled by the purity of the starting materials and the ratios of reactant pressures. Typical reaction mixtures range from about 14 to 32 torr of dimethylcadmium and from about 30 to about 279 torr of hydrogen sulfide. The cadmium sulfide is formed as a reddish orange powder which is used as a precursor for a single crystal production for detector use.

2 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SYNTHESIS OF CADMIUM SULFIDE USING THE SPONTANEOUS REACTION OF DIALKYLCADMIUM AND HYDROGEN SULFIDE

DEDICATORY CLAUSE

The invention described herein may be manufactured, used, and licensed by or for the Government for governmental purposes without the payment to me of any royalties thereon.

BACKGROUND OF THE INVENTION

Cadmium sulfide single crystal is used as a UV detector and in combination with other materials indium antimony (InSb) as a detector for UV and IR detectors. The final product material must meet a very strict set of specifications with respect to spectral transmission, mobility, resistivity, and detector lifetime. The single crystals are prepared using a "proprietary" process which involves chemical vapor deposition by Eagle Picher Laboratories, who is at present the single supplier. It is concluded that the characteristics of the single crystal are drastically affected by the purity of the cadmium sulfide powder used as a precursor to the single crystal. The bases for this conclusion are supported by P. D. Fochs et al, Report No. AE-1-G.1453, Clevite Corporation, Report No. FTD-TT-65-555, General Electric Company, Report No. SR-2,65gc-03 136, and Bell and Howell Research center, Technical Report AF 33-615-276.

Because of the high priority and importance of high purity of precursor material for a single crystal product, a variety of studies have been conducted over the past twenty years with the objective of perfecting a process which would produce purer starting material for ultimate growth of single crystals with specific properties. Predominant leaders in this area include Eagle Picher Laboratories and the Clevite Corporation Research Laboratory. The synthetic work for cadmium sulfide performed by these companies involved the chemical reaction of the elements with thermal activation as necessary.

Hydrogen sulfide is known to be acidic in solution; however, a reaction in liquid solution to yield cadmium sulfide is not desired to be pursued since the required level of purity of the finished product by this route cannot be achieved.

A reaction conducted in the gas phase between hydrogen sulfide and an dialkylcadmium compound is worthy of consideration and further investigation; therefore, an object of this invention is to provide a reaction procedure conducted in the gaseous phase to yield high purity thermodynamically stable cadmium sulfide.

A further object of this invention is to provide a spontaneous reaction procedure conducted in the gaseous phase to yield high purity thermodynamically stable cadmium sulfide.

SUMMARY OF THE INVENTION

A method of synthesis by a spontaneous reaction in the gaseous phase of a first reactant of a dialkylcadmium and a second reactant of hydrogen sulfide to form high purity cadmium sulfide. The gas phase reactions are carried out in stainless steel cells (5×10 cm) equipped with O-ring seals for securing windows (5 cm diameter) onto the cells. Potassium chloride windows are used on the short pathlength (5 cm) for recording the infrared spectra.

Infrared spectra are recorded on a Mattson Sirius 100 interferometer equipped with a water-cooled carborundum source, iris aperture, potassium bromide (KBr) beamsplitter, and triglycine sulfate (TGS) detector. Interferograms are transformed after applying a triangular apodization function with an effective spectral resolution of 1.0 $cm^{-1}$. This resolution is sufficient to allow unequivocal identification of all the products as well as to monitor the decrease of the starting material from its infrared absorption bands.

Typical reaction mixtures involved ranges of 14 to 32 torr of dimethylcadmium and 30 to 279 torr of hydrogen sulfide. These mixtures are prepared and observed to react spontaneously with the formation of a reddish orange precipitate which is cadmium sulfide. Other products are the gaseous products methane and ethene. Infrared spectra of a typical reaction are given in FIG. 2 of the drawing and the specific frequencies used to identify the gaseous products are listed in Table I below.

TABLE I

Frequencies ($cm^{-1}$)* used in the identification of products formed in the spontaneous reaction of dimethylcadmium and hydrogen sulfide.

| 30 Torr Dimethylcadmium | Mixture | Identity | Reference |
|---|---|---|---|
| | 3005 | $CH_4$ | 1 |
| 2930 | | DMC | 2 |
| 2915 | | DMC | 2 |
| 1340 | | DMC | 2 |
| | 1307 | $CH_4$ | 1 |
| 1303 | | DMC | 2 |
| 1130 | | DMC | 2 |
| | 949 | ethene | 1 |
| 705.5 | | DMC | 2 |
| 546 | | DMC | 2 |

*Only the major bands are given

References:

1 G. Herzberg, Infrared and Raman Spectra, (Van Nostrand Reinhold, New York, 1945), First Edition.

2 A. M. W. Bakka, J. Mol. Spectrosc., 41, 19(1972).

The results of this spontaneous reaction are summarized in the following reaction equation:

$$(CH_3)_2Cd + H_2S \rightarrow CdS + 2CH_4$$

DESCRIPTION OF THE PREFERRED EMBODIMENTS

The gas phase spontaneous reaction of a dialkylcadmium and hydrogen sulfide yields the reddish orange precipitate which is cadmium sulfide.

Sample handling is accomplished using standard vacuum line technique. The gas phase reactions are carried out in stainless steel cells (5×10 cm) equipped with O-ring seals for securing windows (5 cm diameter) onto the cells. Potassium chloride windows are used on the short pathlength (5 cm) for recording the infrared spectra.

A preferred dialkylcadmium is dimethylcadmium, and the results of the above described spontaneous reaction are summarized in the following reaction equation:

$$(CH_3)_2Cd + H_2S \rightarrow CdS + 2CH_4$$

Typical reaction mixtures range from about 14 to about 32 torr of dimethylcadmium and from about 30 to about 279 torr of hydrogen sulfide. The mixtures are prepared and observed to react spontaneously to form the solid cadmium sulfide (CdS) and methane. The solid cadmium sulfide in solid form and high purity as determined by infrared major bands is recovered from the reaction chamber.

Figure 1:
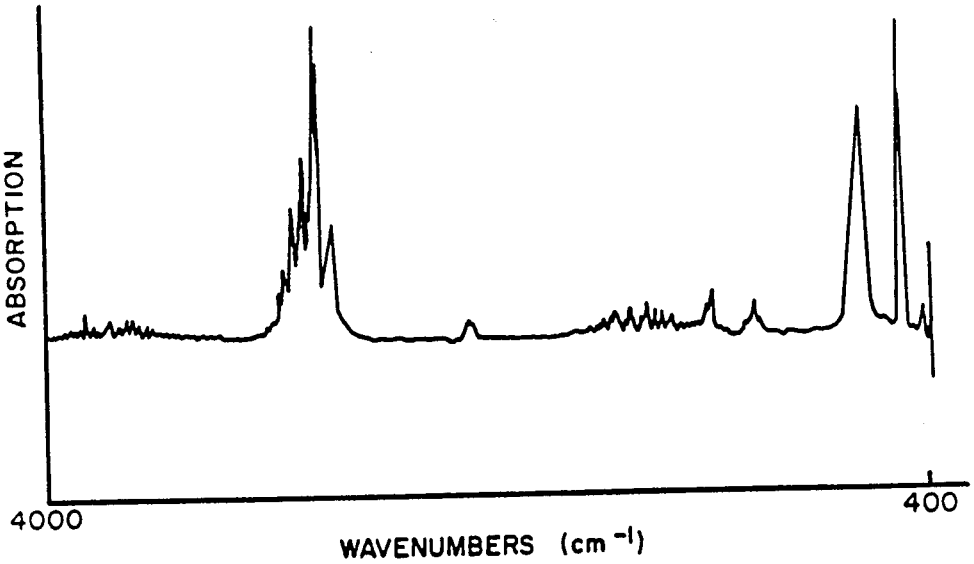
FIG. 1 depicts an infrared spectra of $(CH_3)_2Cd$ at 30 torr.
Figure 2:
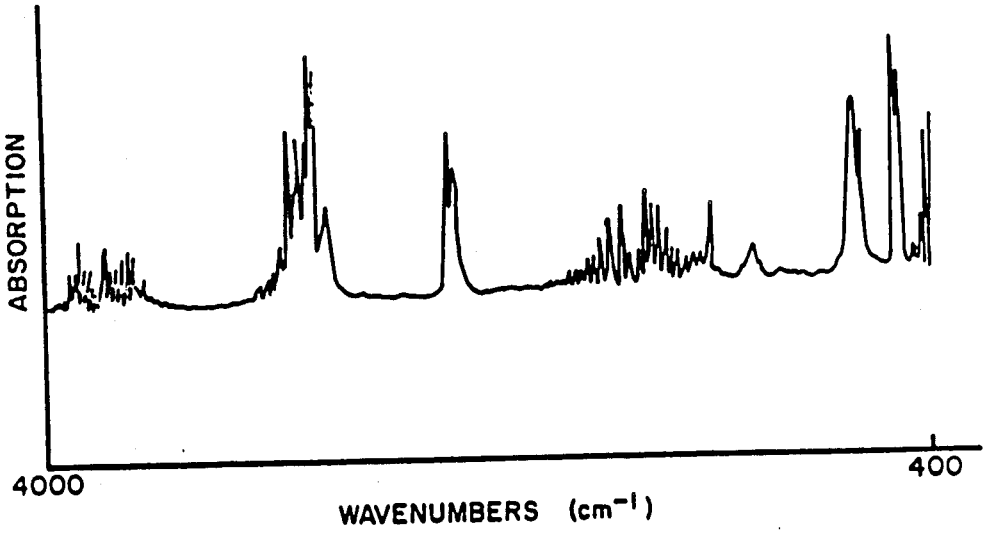
FIG. 2 depicts an infrared spectra of a mixture of resulting compounds formed after the spontaneous reaction of 30 torr of $(CH_3)_2Cd$ and 36 torr $H_2S$.

In further reference to the drawing, FIG. 1 depicts the infrared curve which identifies $(CH_3)_2Cd$ by the frequencies ($cm^{-1}$) of the major bands documented for this compound. FIG. 2 depicts the infrared curve which identifies the compounds in mixture resulting after the spontaneous reaction of 30 torr of $(CH_3)_2Cd$ and 32 torr $H_2S$.

The stoichiometry of the cadmium sulfide depends upon the reactant pressure ratio, and a range of 14 to 32 torr of dimethylcadmium and 30 to 279 torr of hydrogen sulfide react spontaneously to produce cadmium sulfide and methane. The process of forming cadmium sulfide in the gas phase is readily monitored using fourier transform infrared spectroscopy which also permits the identification of gaseous products. The gaseous products of the above reaction included methane and ethene. Since the stoichiometry of the product cadmium sulfide can be controlled by the purity of the starting materials and the ratios of reactant pressures, this process is extremely useful for achieving the production of cadmium sulfide to meet the needs in ultra violet detection and when in combination with other materials, such as in InSb for use as a detector for ultra violet radiation and as a sandwich detector for infrared and ultraviolet radiation.

I claim:

1. A method for the synthesis of cadmium sulfide by the spontaneous reaction of a first and second reactant in the gaseous phase, said method comprising:

(i) providing a stainless steel reaction cell adapted for use with vacuum line techniques and equipped with O-ring seals for securing potassium chloride windows onto said reaction cell to achieve monitoring of said spontaneous reaction and the reaction products formed;

(ii) metering said first reactant which is a dialkylcadmium compound and said second reactant which is hydrogen sulfide into said reaction cell to form a reaction mixture of said dialkylcadmium compound in the range from about 14 to about 32 torr and of said hydrogen sulfide in the range from about 30 to about 279 torr;

(iii) forming a reddish orange precipitate of cadmium sulfide by the spontaneous reaction of said reactants; and, (iv) recovering said cadmium sulfide from said reaction cell.

2. The method of claim 1 wherein said dialkylcadmium compound is dimethylcadmium and wherein said reaction mixture comprises said dimethylcadmium of about 30 torr and said hydrogen sulfide of about 32 torr.

* * * * *